US012628310B2

(12) United States Patent
Ji et al.

(10) Patent No.: US 12,628,310 B2
(45) Date of Patent: May 12, 2026

(54) METHOD FOR CONTROLLING FAN SPEED, AND ELECTRONIC DEVICE

(71) Applicants: INVENTEC (PUDONG) TECHNOLOGY CORPORATION, Shanghai (CN); INVENTEC CORPORATION, Taipei (TW)

(72) Inventors: Jia-Qing Ji, Shanghai (CN); Hai-Xiang Lin, Shanghai (CN); Hua-Xin Hu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 394 days.

(21) Appl. No.: 18/242,542

(22) Filed: Sep. 6, 2023

(65) Prior Publication Data

US 2024/0407128 A1 Dec. 5, 2024

(30) Foreign Application Priority Data

Jun. 2, 2023 (CN) .......................... 202310650923.0

(51) Int. Cl.
H05K 7/20 (2006.01)

(52) U.S. Cl.
CPC ................................ H05K 7/20209 (2013.01)

(58) Field of Classification Search
CPC .. H05K 7/20209; Y02D 10/00; F04D 27/004; F04D 25/166; F04D 27/00
See application file for complete search history.

(56) References Cited

U.S. PATENT DOCUMENTS

2013/0045114 A1* 2/2013 Chang ................... F04D 25/166
417/45

* cited by examiner

*Primary Examiner* — Charles R Kasenge

(57) ABSTRACT

The application discloses a method for controlling a fan speed. The method is applied to a server including a power supply unit, a first fan, and a second fan. The method includes: obtaining a first current control data and comparing the first current control data with a second current control data. A next-stage control data of the second fan is determined according to the first current control data and an increment if it is determined that the first current control data is greater than the second current control data. The second current control data is determined to be the next-stage control data if it is determined that the first current control data is less than or equal to the second current control data.

13 Claims, 3 Drawing Sheets

METHOD FOR CONTROLLING FAN SPEED, AND ELECTRONIC DEVICE

CROSS-REFERENCE TO RELATED DISCLOSURES

This application claims priority to Chinese patent application No. 202310650923.0 filed with the Chinese Patent Office on Jun. 2, 2023, entitled "METHOD FOR CONTROLLING FAN SPEED", the entire contents of which are incorporated by reference.

TECHNICAL FIELD

The present disclosure relates to the technical field of control, and in particular, to a method for controlling a fan speed and an electronic device.

BACKGROUND

Electronic components inside a server will generate heat during operation. If proper heat dissipation is not performed, the increased temperature will affect the performance of the electronic components. Therefore, fans are usually provided in the server to generate airflow within the chassis so as to dissipate heat from the electronic components by thermal convection. In addition, since the power supply unit is a high-power module, an individual fan may be provided in the power supply unit of the existing server to dissipate heat directly from the power supply unit.

SUMMARY

In a first aspect, the present disclosure provides a method for controlling a fan speed, which can be applied to an electronic device. The electronic device includes at least one power supply unit, at least one first fan, and at least one second fan. The at least one first fan is configured to generate air flow through the electronic device. The at least one second fan is configured to generate airflow through the at least one power supply unit. A speed of the at least one first fan is controlled according to a first current control data, and a speed of the at least one second fan is controlled according to a second current control data. The method includes: obtaining the first current control data and the second current control data; comparing the first current control data and the second current control data; determining a next-stage control data of the at least one second fan according to the first current control data and an increment if it is determined that the first current control data is greater than the second current control data; and determining the second current control data as the next-stage control data if it is determined that the first current control data is less than or equal to the second current control data.

In some embodiments, the first current data is transmitted to the at least one power supply unit. After transmitting the first current control data to the power supply unit, the second fan is controlled to run at full speed if it is determined that a communication between the power supply unit and the electronic device is interrupted and an interruption duration is greater than or equal to a preset duration.

In some embodiments, the at least one first fan is arranged in a rear side of a chassis of the electronic device, and multiple electronic components of the electronic device are located upstream of the airflow generated by the at least one first fan. The at least one power supply unit is arranged adjacent to the at least one first fan and on the same plane as the at least one first fan.

In some embodiments, the method for controlling the fan speed provided by the present disclosure may further include: obtaining an air inlet temperature and an air outlet temperature of the at least one power supply unit; and comparing the air inlet temperature and the air outlet temperature and determining whether air backflow is generated in the power supply unit according to the comparison result. The step of obtaining the first current control data is performed if it is determined that the air backflow is generated in the at least one power supply unit.

In some embodiments, after comparing the air inlet temperature and the air outlet temperature, the method for controlling the fan speed provided by the present disclosure further include: determining that the increment is 0% if the air outlet temperature is greater than the air inlet temperature.

In some embodiments, the preset duration is 10 seconds.

In some embodiments, the first current control data, the second current control data, and the next-stage control data are all PWM signals.

In some embodiments, the controlling the second fan to run at full speed if it is determined that the communication between the electronic device and the at least one power supply unit is interrupted and the interruption duration is greater than or equal to a preset duration includes: controlling the second fan to run at full speed if it is determined that a system controller of the electronic device is out of order or an upgrade process is performed.

In a second aspect, an electronic device is provided. The electronic device includes at least one power supply unit, at least one first fan, and at least one second fan. The at least one first fan is configured to generate airflow passing through the electronic device. A speed of the at least one first fan is controlled according to a first current control data. The at least one second fan is configure to generate airflow passing through the at least one power supply unit. A speed of the at least one second fan is controlled according to a second current control data. The electronic device further includes a control chip configured to execute a method for controlling a fan speed. The method includes: obtaining the first current control data; comparing the first current control data with the second current control data; determining a next-stage control data of the at least one second fan according to the first current control data and an increment if it is determined that the first current control data is greater than the second current control data; and determining the second current control data as the next-stage control data if it is determined that the first current control data is less than or equal to the second current control data.

In the present disclosure, the names of the above-mentioned devices or functional modules are not limited, and in actual implementation, these devices or functional modules may appear with other names. As long as the functions of each device or functional module are similar to those of the present disclosure, they all fall within the scope of the present disclosure and its equivalent technologies.

These aspects of the present disclosure will be more concisely understood in the following description.

DETAILED DESCRIPTION OF THE EMBODIMENTS

Figure 1:
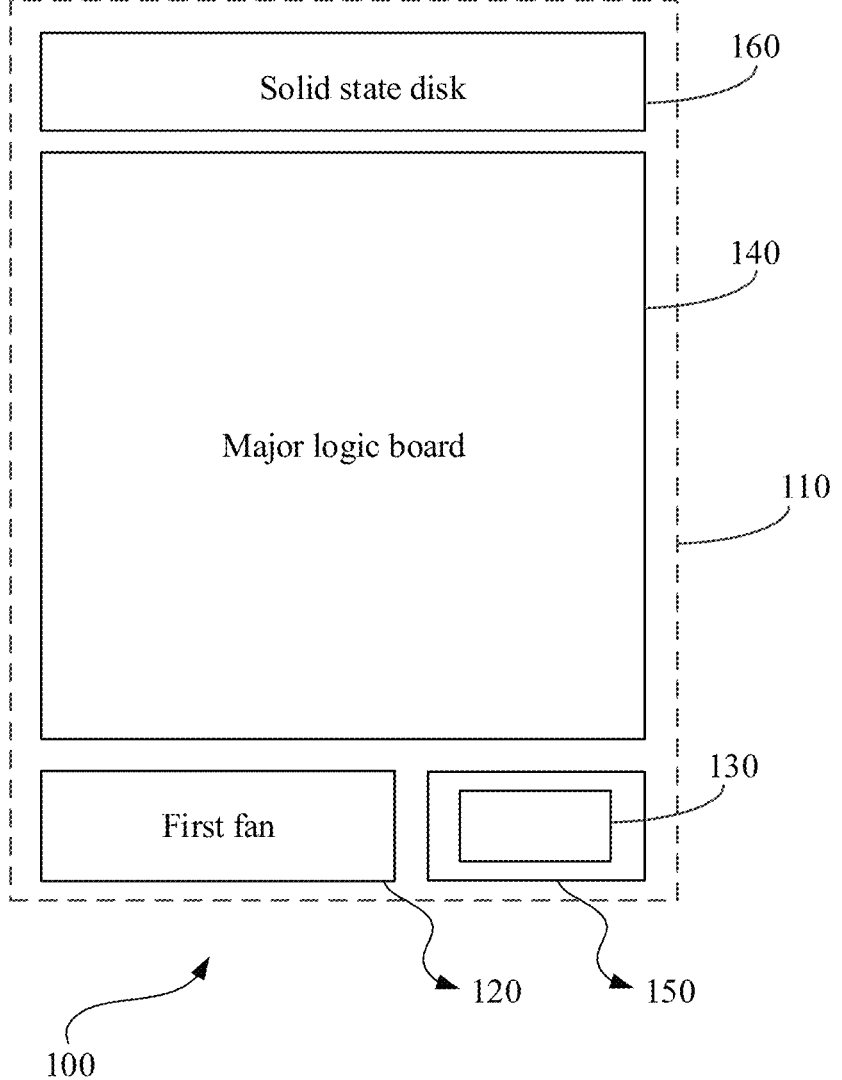
FIG. 1 is a schematic top view of a structural schematic diagram of a server according to an embodiment of the present disclosure.

A method for controlling a fan speed provided by embodiments of the present disclosure will be described in detail below with reference to the accompanying drawings.

The terms "first", "second", etc., in the specification and figures of the present disclosure are used to distinguish different objects, or to distinguish different processes for the same object, rather than to describe a specific sequence of objects.

In addition, the terms "include" and "comprise" in the description of the present disclosure and any variations thereof are intended to cover non-exclusive inclusion. For example, a process, method, system, product, or device that includes a series of steps or units is not limited to the listed steps or units, but may optionally include other unlisted steps or units, or may also optionally include other steps or elements inherent to the process, method, product, or device.

It should be noted that, in the embodiments of the present disclosure, the terms such as "exemplary", "for example", etc., are used as examples, illustrations or explanations. Any embodiment or design solution described as "exemplary" or "for example" in the embodiments of the present disclosure should not be interpreted as being preferred or more advantageous than other embodiments or design solutions. Specifically, the use of the terms such as "exemplary" or "for example" is intended to present related concepts in a specific manner.

In the description of the present disclosure, unless otherwise defined, "multiple" means two or more.

In some servers known to the applicant, a system fan may be arranged at the front side of the chassis to intake airflow into the chassis to cool electronic modules or devices such as a motherboard, a solid-state disk, or a function expansion card. Alternatively, in some servers, a system fan may be arranged at the rear side of the chassis, and an air deflector may be arranged at the front side of the chassis so that airflow enters the chassis and passes through the motherboard, solid-state disk, and function expansion card, etc., in front of the system fan in a pumping manner.

However, for the structure in which the system fan is arranged at the rear side of the chassis, a low-pressure area will be formed in front of the system fan. Since the power supply unit is arranged adjacent to the system fan and in the same plane as the system fan, the air inlet of the power supply unit is located in the low-pressure area formed by the system fan, while the air outlet of the power supply unit is located at the rear of the chassis with a higher air pressure. When the system fan operates at a high load, for the power supply unit, the airflow is easy to flow from the air outlet to the air inlet, causing an air backflow. In this case, the temperature of the airflow at the air inlet of the power supply unit may be higher than that at the air outlet, which is not conducive to the heat dissipation of the power supply unit, causing a high temperature of the electronic components inside the power supply unit, and resulting in damage to the electronic components. In addition, the air backflow may cause the fan of the power supply unit to reverse, resulting in damage to the fan of the power supply unit.

Figure 2:
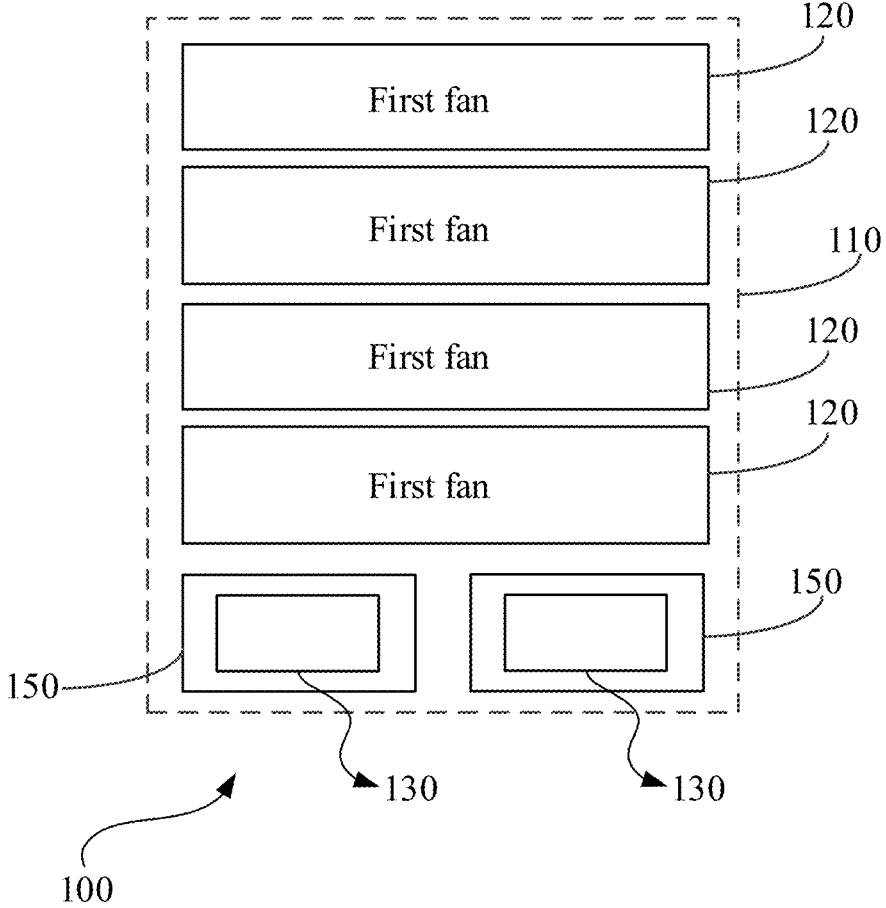
FIG. 2 is a schematic rear view of a structural schematic diagram of a server according to an embodiment of the present disclosure.
Figure 3:
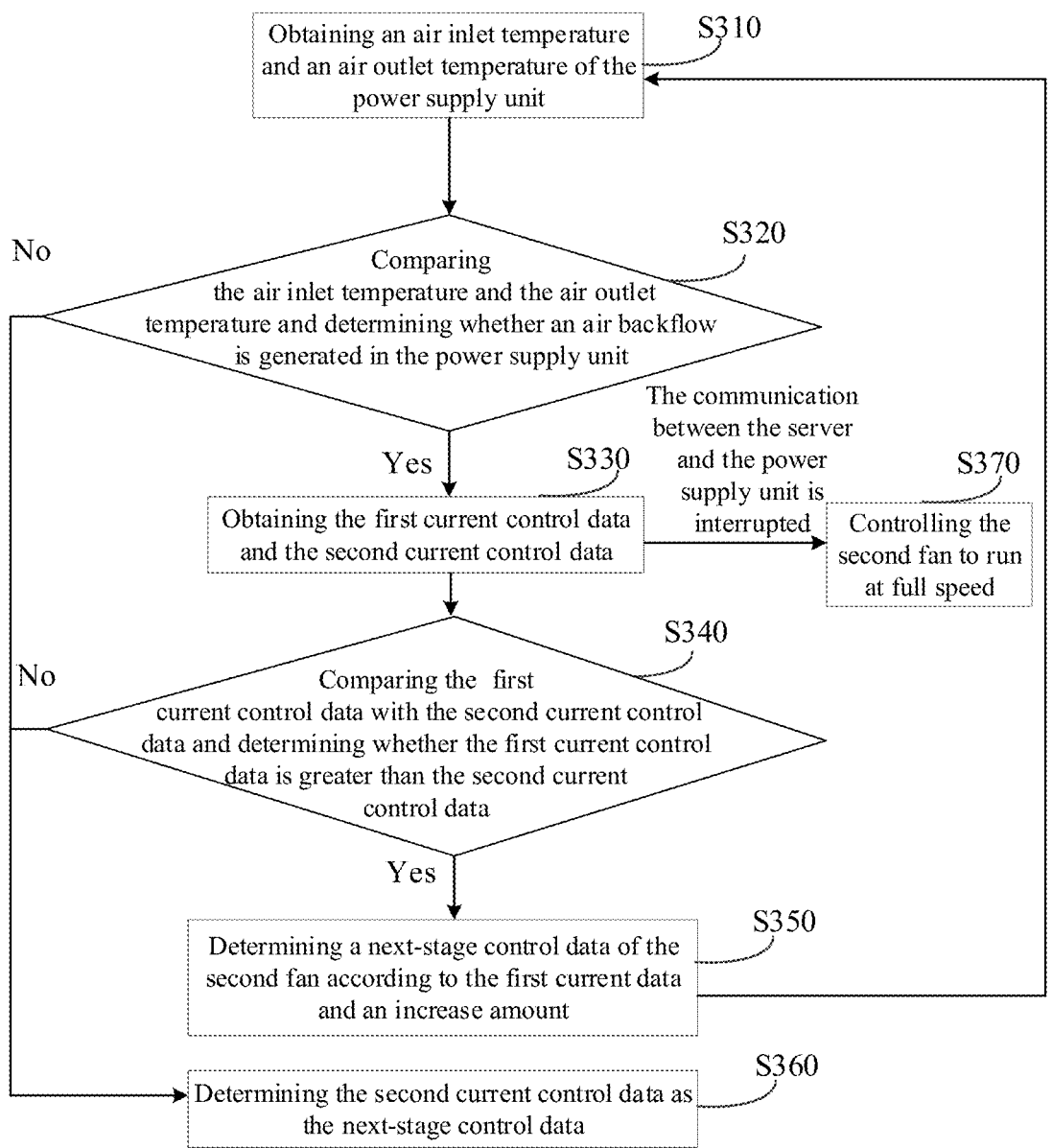
FIG. 3 is a schematic flow chart of a method for controlling a fan speed according to an embodiment of the present disclosure.

Referring to FIG. 1, FIG. 2, and FIG. 3, FIG. 1 is a schematic top view of a structural schematic diagram of a server according to an embodiment of the present disclosure, FIG. 2 is a schematic rear view of a structural schematic diagram of a server according to an embodiment of the present disclosure, and FIG. 3 is a schematic flow chart of a method for controlling a fan speed according to an embodiment of the present disclosure. The method for controlling the fan speed provided by the embodiments of the present disclosure may be applied to the server 100 shown in FIG. 1 or FIG. 2. It should be understood that, in other embodiments, the method for controlling the fan speed may also be applied to other electronic devices having at least one first fan and at least one second fan.

The server 100 includes a chassis 110 and multiple first fans 120. The first fans 120 are arranged on a first side, for example the rear side, of the chassis 110. Multiple electronic components of the server 100 are located upstream of the airflow generated by the first fans 120. A first air inlet and several air deflectors (not shown in FIG. 1 and FIG. 2) are arranged on a second side, for example the front side, opposite the first side of the chassis 110, and a first air outlet is arranged on the first side (e.g., the rear side) of the chassis 110. In the chassis 110, a Major Logic Board (MLB) 140 and a Solid-State Disk (SSD) 160 are arranged in front of the first fans 120. The rotation of the first fans 120 can generate a first airflow. The first airflow can enter the chassis 110 from the first air inlet, flow through the SSD 160 and the BLM 140, and then be discharged from the first air outlet. Based on this, the electronic components on the SSD 160 and the MLB 140 are cooled by way of thermal convection.

Several power supply units (PSUs) 150 are arranged at one side, such as the right side, of the first fans 120. Each power supply unit 150 is provided with a second fan 130. Each power supply unit 150 includes a second air inlet and a second air outlet. Each second air outlet is adjacent to the first air outlet of the chassis 110. Temperature sensors are arranged at the second air inlets and the second air outlets of the power supply units 150, respectively. The temperature sensors are configured to measure the air inlet temperature and the air outlet temperature of the power supply units 150, respectively. For example, the temperature sensors in the embodiments of the present disclosure may be thermocouples.

It should be understood that the number of the fans and the power supply units are not limited in the present disclosure.

Since the power supply units 150 are arranged adjacent to the first fans 120 and on the same plane as the first fans 120, the second air inlets of the power supply units 150 are located in the low-pressure area formed by the first fans 120. The second air outlets of the power supply units 150 are adjacent to the first air outlet of the chassis 110. Therefore, when the first fans 120 operate at a high load, air backflow may be generated in the power supply units 150. When the air backflow is generated in the power supply units 150, the airflow will reversely flow from the second air outlets to the second air inlets, causing the air inlet temperature to be higher than the air outlet temperature.

In addition, in a practical application of the embodiments of the present application, the speeds of the first fans 120 are controlled according to a first current control data, and the speeds of the second fans 130 are controlled according to a second current control data. The greater the value of the current control data, the higher the fan speed. In some embodiments, the first current control data and the second current control data are pulse width modulation signals. The speed of each fan is linearly related to the duty cycle of the corresponding pulse with modulation signal. The larger the duty cycle of the pulse width modulation signal, the higher the fan speed. In other embodiments, the first current control data and the second current control data may also be voltage signals or current signals.

As shown in FIG. 3, a method for controlling a fan speed provided in some embodiments of the present disclosure includes the following steps.

In a step S310, an air inlet temperature and an air outlet temperature of at least one power supply unit are obtained.

Exemplarily, the air inlet temperature and the air outlet temperature of the power supply unit can be obtained from the temperature sensors arranged at the air inlet and the air outlet of the power supply unit.

In a step S320, the air inlet temperature and the air outlet temperature are compared, and it is determined whether an air backflow is generated in the power supply unit based on a comparison result.

In the step S320, the determination of the air backflow can be performed by comparing the air inlet temperature and the air outlet temperature. Specifically, it is determined that the air backflow is generated in the power supply unit if the air inlet temperature is greater than the air outlet temperature, and it is determined that the air backflow is not generated in the power supply unit if the air inlet temperature is lower than the air outlet temperature.

If it is determined that the air backflow is generated in the power supply unit, a step S330 is executed. If it is determined that the air backflow is not generated in the power supply unit, a step S360 is executed.

In the step S330, a first current control data and a second current control data are obtained. The first current control data is configured to control the speed of the first fans of the server. The second current control data is configured to control the speed of the second fans in the power supply unit.

After the step S330, a step S340 is executed.

In some embodiments, the first current control data is transmitted to the power supply unit. After the first current control data is transmitted to the power supply unit, if it is determined that the communication between the server and the power supply unit is interrupted and the interruption duration is greater than or equal to a preset duration, a step S370 is executed.

In some embodiments, the preset duration may be set according to actual needs. For example, the preset duration may be 10 seconds.

In some embodiments, the communication interruption between the server and the power supply unit may be a failure of the system controller of the server or an upgrade process.

In the step S340, the first current control data is compared with a second current control data, and it is determined whether the first current control data is greater than the second current control data.

If it is determined that the first current control data is greater than the second current control data, a step S350 is executed. If it is determined that the first current control data is less than or equal to the second current control data, a step S360 is executed.

In the step S350, a next-stage control data of the second fan is determined according to the first current control data and an increment.

The load of the second fan can be controlled according to the next-stage control data after determining the data obtained by increasing the first current control data by the increment as the next-stage control data of the second fan.

The increment can be obtained by multiplying the first current control data by an appropriate percentage. For example, the increment may be 5% of the first current control data.

After the step S350, the process returns to the step S310, and the steps S310 to S350 are repeated.

In the step S360, the second current control data is determined as the next-stage control data.

After determining the second current control data as the next-stage control data, i.e., the increment is 0%, the load of the second fan can be controlled according to the next-stage control data.

In step S370, the second fan is controlled to run at full speed.

The second fan is controlled to run at full speed, which means that the load of the second fan is 100%. In this way, the air backflow in the power supply unit can be directly prevented.

In addition, the first current control data, the second current control data, and the next-stage control data in the embodiments of the present disclosure are all pulse width modulation (PWM) signals.

In some embodiments, the method for controlling the fan speed may be executed by a control chip of the server.

The method for controlling the fan speed provided in the embodiments of the present disclosure can prevent the airflow from flowing back to the power supply unit of the server. Specifically, the control data (i.e., the next-stage control data in the embodiments of the present disclosure) of the second fan for cooling the power supply unit can be changed based on the control data (i.e., the first current control data in the embodiments of the present disclosure) of the first fan for cooling the server, finally causing the load of the second fan to be greater than the load of the first fan. Therefore, the embodiments of the present disclosure solve the problem of reduced dissipation efficiency caused by airflow back to the power supply units when the first fans operate at a relatively high load. In this way, by using the method for controlling the fan speed provided by the embodiments of the present disclosure, the power supply units can adapt to different server architectures with rear-mounted fans, eliminating the problem of air flow back to the power supply units caused by the fact that system fans (i.e., the first fans in the embodiments of the present disclosure) are in the same plane as the second fans of the power supply units. In addition, in the embodiments of the present disclosure, over-protection of the power supply units can be reduced while the power supply units can be maximally protected, and the dependence on the air deflector of the power supply unit is reduced.

Therefore, the problem that air backflows to the power supply unit when the system fan operates at a relatively high load can be solved by the present disclosure. Therefore, the method for controlling the fan speed provided in the present disclosure can facilitate the heat dissipation of the power supply unit, thereby avoiding damage to the electronic components inside the power supply unit caused by the high temperature of the electronic components. In addition, since the problem of air backflow is solved, the reverse of the fan of the power supply unit (i.e., the second fan in the present disclosure) caused by the air backflow can be avoided in the present disclosure, thereby avoiding damage to the second fan caused by air backflow.

The above detailed description of the preferred specific embodiments is to describe the technical solution of the present application more clearly, rather than to limit the protection scope of the present application with the preferred specific embodiments described above (that is, the scope of protection of the present application The scope of protection is not limited to this). On the contrary, the intention is to cover various changes and equivalents within the protection scope of the present application.

What is claimed is:

1. A method for controlling a fan speed that is applied to an electronic device, the electronic device comprising at least one power supply unit, at least one first fan, and at least one second fan, the at least one first fan being configured to generate airflow passing through the electronic device, the at least one second fan being configured to generate airflow passing through the at least one power supply unit, a speed of the at least one first fan being controlled according to a first current control data, and a speed of the at least one second fan being controlled according to a second current control data, wherein the method comprises:

obtaining the first current control data and the second current control data;

comparing the first current control data with the second current control data;

determining a next-stage control data of the at least one second fan according to the first current control data and an increment if it is determined that the first current control data is greater than the second current control data; and determining the second current control data as the next-stage control data if it is determined that the first current control data is less than or equal to the second current control data;

wherein the method further comprises:

transmitting the first current control data to the at least one power supply unit; and controlling, after the first current control data is transmitted to the power supply unit, the at least one second fan to run at full speed if it is determined that a communication between the electronic device and the at least one power supply unit is interrupted and an interruption duration is greater than or equal to a preset duration.

2. The method for controlling the fan speed according to claim 1, wherein the at least one first fan is arranged at a rear side of a chassis of the electronic device, multiple electronic components of the electronic device are located upstream of an airflow generated by the at least one first fan, and the at least one power supply unit is arranged adjacent to the at least one first fan and on the same plane as the at least one first fan.

3. The method for controlling the fan speed according to claim 1, before the obtaining the first current control data and the second current control data, the method further comprising:

obtaining an air inlet temperature of the at least one power supply unit and an air outlet temperature of the at least one power supply unit; and comparing the air inlet temperature of the at least one power supply unit and the air outlet temperature of the at least one power supply unit, and determining whether an air backflow is generated in the at least one power supply unit according to a comparison result, wherein the obtaining the first current control data and the second current control data is performed if it is determined that the air backflow is generated in the at least one power supply unit.

4. The method for controlling the fan speed according to claim 3, wherein after comparing the air inlet temperature and the air outlet temperature, the method further comprises:

determining that the increment is 0% if the air outlet temperature is greater than the air inlet temperature.

5. The method for controlling the fan speed according to claim 1, wherein the preset duration is 10 seconds.

6. The method for controlling the fan speed according to claim 1, wherein the first current control data, the second current control data, and the next-stage control data are all pulse width modulation signals.

7. The method for controlling the fan speed according to claim 1, wherein the controlling the at least one second fan to run at full speed if it is determined that the communication between the electronic device and the at least one power supply unit is interrupted and the interruption duration is greater than or equal to the preset duration comprises:

controlling the at least one second fan to run at full speed if it is determined that a system controller of the electronic device is out of order or an upgrade process is performed.

8. An electronic device, comprising:

at least one power supply unit;

at least one first fan, configured to generate airflow passing through the electronic device, a speed of the at least one first fan being controlled according to a first current control data;

at least one second fan, configured to generate airflow passing through the at least one power supply unit, a speed of the at least one second fan being controlled according to a second current control data; and a control chip, configured to execute a method for controlling a fan speed, wherein the method comprises:

obtaining the first current control data and the second current control data;

comparing the first current control data with the second current control data;

determining a next-stage control data of the at least one second fan according to the first current control data and an increment if it is determined that the first current control data is greater than the second current control data; and determining the second current control data as the next-stage control data if it is determined that the first current control data is less than or equal to the second current control data;

wherein the method further comprises:

transmitting the first current control data to the at least one power supply unit; and controlling, after the first current control data is transmitted to the power supply unit, the at least one second fan to run at full speed if it is determined that a communication between the electronic device and the at least one power supply unit is interrupted and an interruption duration is greater than or equal to a preset duration.

9. The electronic device according to claim 8, wherein the at least one first fan is arranged at a rear side of a chassis of the electronic device, multiple electronic components of the electronic device are located upstream of an airflow generated by the at least one first fan, and the at least one power supply unit is arranged adjacent to the at least one first fan and on the same plane as the at least one first fan.

10. The electronic device according to claim 8, wherein the electronic device further comprise temperature sensors arranged at an air inlet and an air outlet of the at least one power supply unit to measure an air inlet temperature and an air outlet temperature of the power supply unit, respectively, wherein before the obtaining the first current control data and the second current control data, the method further comprising:

obtaining an air inlet temperature and an air outlet temperature of the at least one power supply unit; and comparing the air inlet temperature and the air outlet temperature, and determining whether air backflow is generated in the at least one power supply unit according to a comparison result, wherein the first current control data and the second current control data are obtained if it is determined that the air backflow is generated in the at least one power supply unit.

11. The electronic device according to claim 10, wherein after comparing the air inlet temperature and the air outlet temperature, the method further comprises:

determining that the increment is 0% if the air outlet temperature is greater than the air inlet temperature.

12. The electronic device according to claim 8, wherein the first current control data, the second current control data, and the next-stage control data are all pulse width modulation signals.

13. The electronic device according to claim 8, the controlling the at least one second fan to run at full speed if it is determined that the communication between the electronic device and the at least one power supply unit is interrupted and the interruption duration is greater than or equal to the preset duration comprises:

controlling the at least one second fan to run at full speed if it is determined that a system controller of the electronic device is out of order or the electronic device is in an upgrade process.

\*    \*    \*    \*    \*